United States Patent [19]

Fox et al.

[11] Patent Number: 4,514,584
[45] Date of Patent: Apr. 30, 1985

[54] ORGANIC PHOTOVOLTAIC DEVICE

[75] Inventors: Sidney W. Fox; Aleksander T. Przybylski, both of Miami, Fla.

[73] Assignee: University of Miami, Coral Gables, Fla.

[21] Appl. No.: 448,236

[22] Filed: Dec. 9, 1982

[51] Int. Cl.$^3$ .............................................. H01L 31/04
[52] U.S. Cl. .................................................. 136/263
[58] Field of Search ................ 136/263, 244; 429/111

[56] References Cited

U.S. PATENT DOCUMENTS

| | | | |
|---|---|---|---|
| 3,052,655 | 9/1962 | Fox | 528/313 |
| 4,281,053 | 7/1981 | Tang | 430/58 |
| 4,367,369 | 1/1983 | Mizutani et al. | 136/263 |

OTHER PUBLICATIONS

Y. A. Ovchinnikov et al., "Photoelectric and Spectral Responses of Bacteriorhodopsin Modified by Carbodiimide and Amine Derivatives", *European J. Biochem.*, 127, pp. 325–332, (1982).

G. A. Chamberlain, "Organic Solar Cells: A Review", *Solar Cells*, 8, (1983), pp. 47–83.

*Primary Examiner*—Aaron Weisstuch
*Assistant Examiner*—Hunter L. Auyang
*Attorney, Agent, or Firm*—Brumbaugh, Graves, Donohue & Raymond

[57] ABSTRACT

A photovoltaic device has as its photoactive electron-donor component a thermal condensation polymer of at least one monoaminodicarboxylic acid and has as its photoactive electron-acceptor component a thermal condensation polymer of at least one basic amino acid, e.g., a diaminomonocarboxylic acid, said polymers containing photoactive flavin and pterin pigments.

13 Claims, 2 Drawing Figures

ORGANIC PHOTOVOLTAIC DEVICE

The present invention relates to photovoltaic devices, converting light energy, and in particular solar energy into electrical energy.

Wafers of crystalline silicon form the photoconductive components of standard photovoltaic devices. A need for simpler technology in production of more economical photocells has stimulated a few new approaches. Most attention has been given to amorphous silicon films and to some organic semiconductors and dyes, e.g. U.S. Pat. No. 4,281,208. Some biomimetic solutions have been proposed, e.g. U.S. Pat. No. 4,197,142. Such devices are made as a rule in a film-sandwich assembly. All of the above-mentioned types of photovoltaic device reported to date are of low efficiency and short life. Photosensitive organic tissue-like devices have not yet been reported. In this specification, the elemental components of such a photovoltaic structure are described.

The present invention provides an improved photovoltaic device. More specifically, an organic type of photosensitive element with oriented constituent elements based on thermal polymers of amino acids is described as improvements resulting from new discoveries.

Photochemical processes are associated with trapping of photons, charge separation, and generation of electrical potentials which, within biological objects, proceed on protein-containing membranes and in cellular and subcellular structures. Such structures have been recognized as potential sources of practical electromotive force.

While thermal polyamino acids, referred to as thermal proteins in Chemical Abstracts, have been known to be photosensitive, we have recently found them to be capable of providing electric power. They have also been discovered to contain pigments of the pterin and flavin classes, such pigments having been formed during heating of the amino acids. The photosensitivity is largely or entirely due to these pigments.

The above is part of the physical basis of the present invention. The identity of polyamino acid, the size of cellular element, thickness of the membrane, and the electrical polarization of the membrane as well as its electromotive force have also been found by us to be capable of controlled combination into photosensitive arrangements. The efficiency of these tissue-like combinations depends upon the identity of the mateial and upon the particular mode of combination. In addition, certain combinations impart to the components and to the assembly qualities of stability that were otherwise absent.

In addition to the advantages described, these materials and assemblies are simple and economical to produce.

The invention concerns the use of the novel materials and of economical photoconductive laminates or membranes in various arrangements in solar cells.

More specifically, the novel materials which have been discovered to be useful in various kinds of assembly are, in particular, thermal polymers of amino acids. The structures of these polymers are illustrated by:

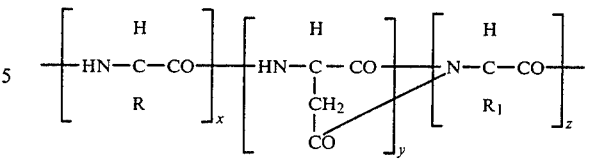

The numbers $x$, $y$, and $z$ can be any numbers, typically under 1,000. The actual sequence of $x$ (general amino acid residue), $y$ (aspartoylimide when combined with $=N$ as in the formula), and $z$ (other general amino acid residue) can be any of an almost limitless variety; the formula given here does not specify the actual sequence.

Instead of aspartoylimide,

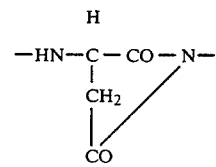

$y$ can be aspartoyl

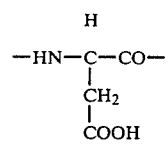

or $y$ can be glutamoyl

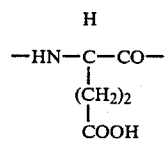

instead of, or in addition to, aspartoyl and aspartoylimido.

A structure embodying the linkage to the polymers of pigments formed on heating the amino acids has been proposed by Hartmann, Brand, and Dose in *BioSystems* vol. 13, 141–147 (1981), as in FIG. 2.

Polymers of amino acids may be economically prepared by heating appropriate mixtures of amino acids as set forth in Fox and Harada, U.S. Pat. No. 3,052,655 and Fox and Harada, U.S. Pat. No. 3,076,790.

As stated, the heating procedure produces within the polymers photoactive pigments, i.e., flavins and pterins, which contribute to the desired photactivity of the polymers. The photoelectric activity of these pigments in association with thermal polyamino acids is a novel aspect of this invention.

Although it has often been assumed that the thermal reaction of several kinds of amino acid would yield a disordered mixture of polymers, it is found that the determinate degree of heterogeneity is as limited as it is for other polymers familiar to industrial polymer chemists. The components of these reactions may be varied at will, and the polymeric products can be fractionated to a small number of peptides, each containing its amino acids in stoichiometric ratios. These ratios, of either the individual peptides or the total array, differ from those in the reaction mixture.

The polarity and other physical properties of each polymer can be controllably varied by choice of R-groups in the amino acids included in the reaction mixture. Thus, for example, a given polymer may be composed so as to be either an electron donor or an electron acceptor or both in varying degrees.

The control of electropositive and electronegative properties of the polymers can be managed in large part through choice of amino acids. The proteinaceous amino acids, for example, are acidic, neutral, or basic. The acidity, basicity, or neutrality of the thermal polyamino acids is controlled by the proportions of the various types of amino acids within the polymers, and by other factors. One other such factor is the degree of amidation of carboxyl groups. The present invention is based upon the discovery that thermal condensation polymers of amino acids (sometimes referred to heretofore as thermal proteins or proteinoids) have photoactivated electrical properties and that there are two groups of thermal condensation polymers of amino acids, one group of which has electron donor or electronegative properties and the other group of which has electron acceptor or electropositive properties. These two groups of polymers, therefore, can be used as the photoactive electron-donor component and as the photoactive electron acceptor component of photovoltaic devices.

The following examples 1–3 are illustrative of the preparation of typical photoactive electron donor thermal coondensation polymers of amino acids.

EXAMPLE 1

To prepare the thermal condensation homopolymer of aspartic acid, DL-aspartic acid (200 g.) is packed tightly on the bottom of a 1 liter Erlenmeyer flask and is heated at 190° C. for 10 hours under nitrogen atmosphere. The slightly colored product is powdered and dialyzed for 4 days against distilled water. The insoluble power is collected and dried for a yield of 71.0 g. of polyaspartic acid.

EXAMPLE 2

To prepare the thermal condensation copolymer of aspartic acid and glutamic acid, a mixture of 1 g. each of aspartic acid and glutamic acid is heated for 5 hours at 180° C. The heating can be conducted in the open air or under nitrogen. The resulting product is dialyzed for 24 hours with running water and the retentate is then lyophilized.

EXAMPLE 3

To prepare the thermal condensation copolymer of aspartic acid and glycine, a mixture of 1.33 g. (0.01 mole) of aspartic acid and 0.75 g. (0.01 mole) of glycine is heated for 5 hours at 180° C. The heating can be conducted in open air or under nitrogen. The resultant product is dialyzed for 24 hours with running water and the retentate then lyophilized.

The following Examples 4–6 are illustrative of the preparation of typical photoactive electron-acceptor thermal condensation polymers of amino acids.

EXAMPLE 4

To prepare the thermal condensation homopolymer of lysine, 100 g. of DL-lysine is heated for 7 hours at 200° C., dissolved in water and dialyzed. The yield of polylysine is about 10 g.

Alternatively, 100 g. of DL-lysine hydrochloride is heated for 7 hours at 200° C., dissolved in water and dialyzed. The yield of polylysine is about 10 g.

EXAMPLE 5

To prepare the thermal condensation copolymer of lysine and arginine, a mixture of 50 g. each of lysine and arginine is heated for 7 hours at 200° C., dissolved in water and dialyzed.

EXAMPLE 6

To prepare the thermal condensation copolymer of lysine and glycine, DL-lysine, 1.46 g. (0.01 mole), and glycine, 0.75 g. (0.01 mole) are heated at 190° C. for 1 hour in a test tube under an atmosphere of nitrogen. The amber colored product is rubbed with a glass rod to form a granular precipitate. The entire material is dialyzed for 2 days against distilled water for a yield of 0.68 g.

We have also found that the photovoltaic properties of the amino acid polymers can be increased by admixing therewith natural or synthetic photoactive or light absorptive pigments (dyes), such as chlorophyll, plastoquinone, rhodamine, eosin, merocyanine, etc. Additionally, donor or acceptor doping of the above polymers is further advantageous in producing organic photosensitive devices.

The product of the present invention is, accordingly, a photovoltaic device having as its photoactive electron donor or electronegative component a thermal condensation polymer (homopolymer or copolymer) of at least one monoaminodicarboxylic acid, such as aspartic acid or glutamic acid, and having as its photoactive electron acceptor or electropositive component a thermal condensation polymer (homopolymer or copolymer) of at least one basic amino acid, e.g., a diaminomonocarboxylic acid, such as arginine or lysine. The monoaminodicarboxylic acid and/or the basic amino acid can be thermally copolymerized with a monoaminomonocarboxylic acid, such as glycine. The polymer may however be a single polymer containing both electronegative and electropositive groups at different sites within the single polymer molecule.

DESCRIPTION OF THE DEVICE

The thermal condensation polymers of amino acids used as the electron-donor and electron-acceptor components of the photovoltaic devices of the invention can be incorporated into three types of photosensitive devices, assembled depending upon the chosen photosensitive element which may be:
  (a) film sandwich layers of the photosensitive materials,
  (b) photogalvanic cell or
  (c) photosensitive half-cells.

Preparation of Photosensitive Elements

Preparation of films

The polymer film has been deposited by
  (a) immersion of metal-coated glass into a solution of the polymer and subsequent removal and subjection to drying;
  (b) electrophoretic deposition of the polymer on metal-coated glass;

(c) vacuum deposition of the polymer on the metal-coated glass.

Preparation of Photoactive Spherules

Example A

In preparation of photosensitive spherules, a mixture of one part by weight of thermal copolyamino acid and one part by weight of potassium chloride in water is heated to boiling and then cooled, or is sonicated for 20 sec. Spherules separate.

Example B

Four parts by weight of acidic polymer from Examples 1–3 in warm water, and one part by weight of basic polymer from Examples 4–6 are dissolved in warm water. The two clear solutions are mixed and the resultant solution is allowed to cool. Microspheres composed of both acid and basic polymers separate.

Assembly of the Photoactive Elements

The mode of assembly of the photoactive elements can be illustrated by a description of the following drawings:

Figure 1:
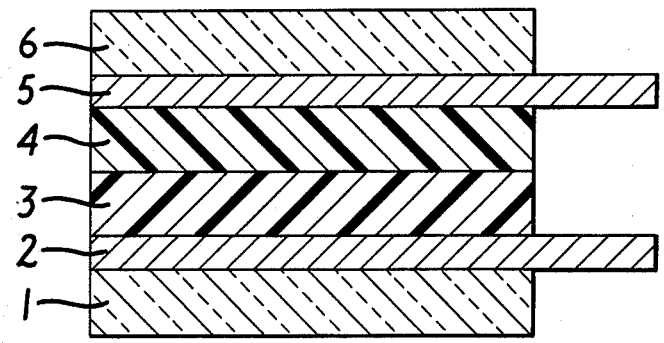
FIG. 1 is a cross-section of the laminate photosensitive element consisting of the polymer and dye film layers between metallic electrodes and glass substrate.
Figure 2:
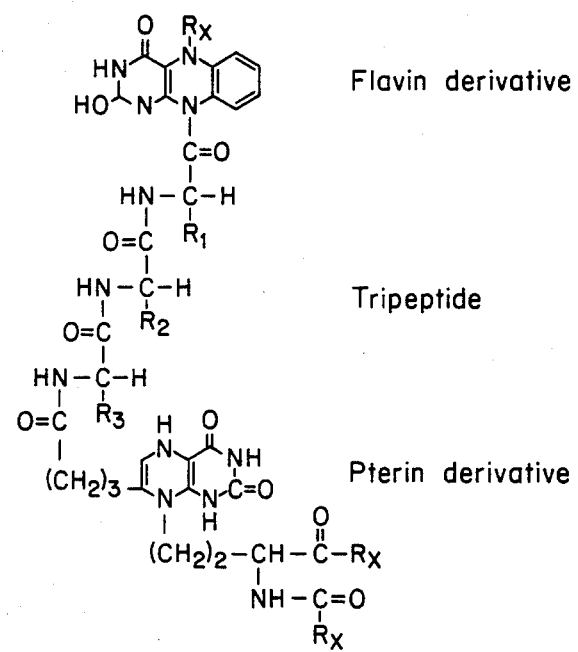
FIG. 2 is a structural formula of a thermal condensation polymer containing both photoactive flavin and pterin pigments usable in a photovoltaic device of the invention.

The thermal condensation polymers of amino acids can form the electron donor and electron acceptor components of photovoltaic devices of the invention, such as the film-sandwich type photovoltaic devices wherein these polymers are present as films or layers. In the first case (FIG. 1) the p-n photoelectric junction cell is made so that two such film layers (3,4) of opposite sign in their photovoltaic characteristics are deposited on the background metallic electrodes (2,5) deposited on glass substrates (1,6), respectively, and attached together finally. The resultant short circuit current and open circuit voltage of photosensitive elements of this type is over 100 nA/cm$^2$ and above 1 volt.

However, these polymers can also form the photoactive electron donor and electron acceptor components of other photovoltaic devices of the invention, such as those photovoltaic devices wherein these polymers are present as assemblies of oppositely charged spherules or vesicules.

What is claimed is:

1. A photovoltaic device having as its photoactive electron donor component a thermal condensation polymer of at least one monoaminodicarboxylic acid and having as its photoactive electron acceptor component a thermal condensation polymer of at least one basic amino acid, said polymers containing both photoactive flavin and pterin pigments.

2. A photovoltaic device according to claim 1, wherein the photoactive electron donor component is a thermal condensation homopolymer of a monoaminodicarboxylic acid.

3. A photovoltaic device according to claim 2, wherein the photoactive electron donor component is a thermal condensation homopolymer of aspartic acid.

4. A photovoltaic device according to claim 1 wherein the photoactive electron donor component is a thermal condensation copolymer of monoaminodicarboxylic acids.

5. A photovoltaic device according to claim 4 wherein the photoactive electron donor component is a thermal condensation copolymer of aspartic acid and glutamic acid.

6. A photovoltaic device according to claim 1, wherein the photoactive electron donor component is a thermal condensation copolymer of at least one monoaminodicarboxylic acid and at least one monoaminomonocarboxylic acid.

7. A photovoltaic device according to claim 1, wherein the photoactive electron acceptor component is a thermal condensation homopolymer of a basic amino acid.

8. A photovoltaic device according to claim 7 wherein the photoactive electron acceptor component is a thermal condensation homopolymer of lysine.

9. A photovoltaic device according to claim 1, wherein the photoactive electron acceptor component is a thermal condensation copolymer of basic amino acids.

10. A photovoltaic device according to claim 1, wherein the photoactive electron acceptor component is a thermal condensation copolymer of at least one basic amino acid and at least one monoaminomonocarboxylic acid.

11. A photovoltaic device according to claim 1, wherein a natural or synthetic photoactive pigment other than photoactive flavin and pterin pigments is admixed with the photoactive electron donor component.

12. A photovoltaic device according to claim 1, wherein a natural or synthetic photoactive pigment other than photoactive flavin and pterin pigments is admixed with the photoactive electron acceptor component.

13. A photovoltaic device composed of thermal condensation polymers of acidic, basic, or neutral amino acids or combinations thereof assembled in p-n photoactive surfaces, said polymers containing both photoactive flavin and pterin pigments.

* * * * *